United States Patent [19]
Kin-shon

[11] Patent Number: 5,323,845
[45] Date of Patent: Jun. 28, 1994

[54] HEAT SINK CLIP ASSEMBLY

[76] Inventor: Lu Kin-shon, 2F., 156 Si-Ning South Road, Taipei, Taiwan

[21] Appl. No.: 62,578

[22] Filed: May 17, 1993

[51] Int. Cl.⁵ .............................................. H05K 7/20
[52] U.S. Cl. .................. 165/80.3; 174/16.3; 361/702
[58] Field of Search ............ 165/80.2, 80.3, 185; 361/702, 703; 174/16.3

[56] References Cited

U.S. PATENT DOCUMENTS

| | | | |
|---|---|---|---|
| 4,679,118 | 7/1987 | Johnson et al. | 174/16.3 X |
| 4,712,159 | 12/1987 | Clemens | 174/16.3 X |
| 4,716,494 | 12/1987 | Bright et al. | 165/80.3 X |
| 4,745,456 | 5/1988 | Clemens | 165/80.2 X |

Primary Examiner—John C. Fox
Attorney, Agent, or Firm—Pro-Techtor International

[57] ABSTRACT

An improved heat sink clip assembly comprises a pair of retaining members in elongated type for readily retained at opposite sides of an electronic device package. A finned heat sink having integral holders at opposite sides is placed over the package and defines the retaining members by means of the holders. Each retaining member is formed with a shoulder and has at least one tongue along the shoulder and respective hook at both upraising ends. A wire clip is detachably engaged with each end hook to secure the whole assembly all together.

2 Claims, 1 Drawing Sheet

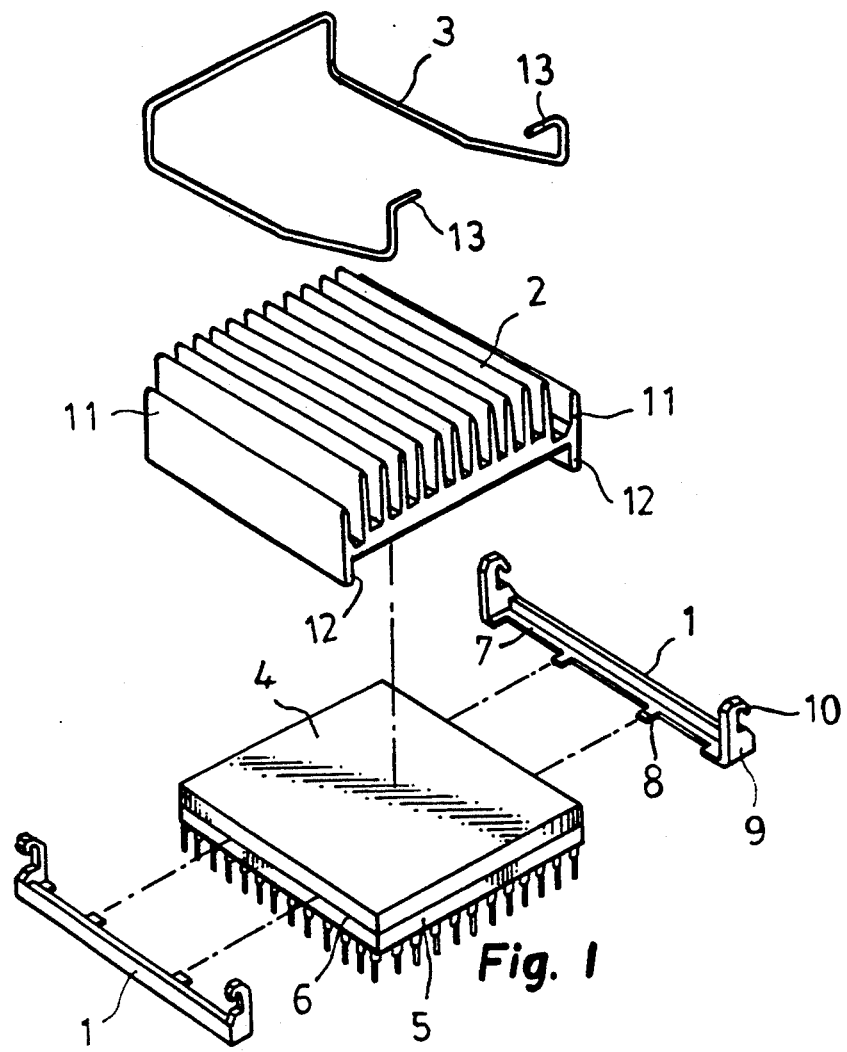
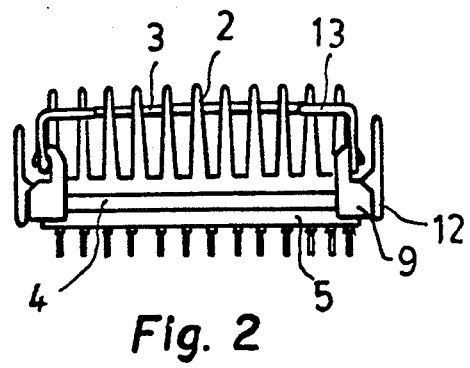

HEAT SINK CLIP ASSEMBLY

FIELD OF THE INVENTION

This invention relates to an improvement relating to heat sink clip assembly. More particularly, it relates to the improved heat sink clip assembly readily mounted onto an electronic device package without the necessary to disengage the package from the printed circuit board.

BACKGROUND OF THE INVENTION

U.S. Pat. No. 4,745,456 disclosed a heat sink clip assembly comprising a frame and a clip for securing and aligning a heat sink with an electronic device package. The frame includes a cavity for receiving the electronic device package with the leads thereof exposed for mounting on a printed circuit board. In this design, the electronic device package must be disengaged from the printed circuit board before the frame is mounted, and engaged again thereafter. Since there are a plurality of leads on the package to be correspondingly inserted into a plurality of aligned preformed holes in the printed circuit board, so that it is a tedious and troublesome work to diengage and then to engage again the package with respect to the printed circuit board, respectively, before and after the mounting of the frame on said package.

SUMMARY OF THE INVENTION

Therefore, the object of this invention is to provide an improved heat sink clip assembly comprising a pair of retaining members in elongated type, each formed with an inner shoulder having at least one inward tongue and hooks at both upraising ends, being readily retained at opposite sides of an electronic device package; a finned heat sink placed over said package and having integral holders at opposite sides to define said retaining members, respectively; and a wire clip detachably engaged with all said hooks to secure the whole assembly all together.

With the structure of this invention, the retaining members are readily mounted at opposite sides of the electronic device package and the like by inserting the tongues at inner shoulders thereof under said package, namely, at the intermediate gap between said package and the printed circuit board or its socket thereunder. So that for mounting the improved heat sink clip assembly of the present invention, it is not necessary to disengage the package from and thereafter to engage it again onto the printed circuit board or its socket.

BRIEF DESCRIPTION OF THE DRAWINGS

The aforementioned and other objects, features and advantages of the present invention will be apparent from the following description in detail with reference to the embodiment illustrated in the accompanying drawings, in which FIG. 1 is an exploded perspective view of the improved heat sink clip assembly according to the preferred embodiment of the invention; and FIG. 2 is a side view of the improved heat sink clip assembly of FIG. 1.

DETAILED DESCRIPTION OF THE PREFERRED EMBODIMENT

Now, the reference is made to FIGS. 1 and 2, in which the improved heat sink clip assembly comprises mainly a pair of retaining members 1, a finned heat sink 2 and a wire clip 3, to be used in conjunction with an electronic device package 4 and its associated printed circuit board or its socket 5 as shown in combination state, with a slight gap therebetween, as schematically shown by the boundary line 6.

The retaining member 1 in elongated type is formed with an inner shoulder 7, optionally having at least one wedged type inward tongue 8 (two as shown) along said shoulder 7 and both upraising ends 9 having respective outward hook 10. The heat sink 2 has a plurality of upward fins and holders 11 at opposite sides. The holders 11 have respective suspending leg 12. The wire clip 3 is in substantial U shape with deflected free ends 13.

In the operation of mounting this improved heat sink clip assembly, it needs only to retain both retaining members at opposite sides of the electronic device package 4 by simply inserting the shoulder 7, optionally by means of the tongues 8, into the gap 6 between said package 4 and the printed circuit board or its socket 5 in combination beneath thereof, in such way that the shoulders 7 support said package 4 at opposite sides. Then, the heat sink 2 is placed over said package 4 in surface contact to each other, with the suspending legs 12 of opposite holders 11 define the retaining members 1 in place. Finally, the wire clip 3 is engaged by the hooks 10 at four corners of the assembly to secure it all together.

On the contrary, when the assembly will be removed, the only one thing to do is to disengage said wire clip 3 out of the hooks 10, then the heat sink 2 and both retaining members 1 are removed spontaneously.

While there have been shown and described what are at present considered the preferred embodiment of the present invention, it will be obvious to those skilled in the art that various changes and modifications may be made therein without departing from the spirit and the scope of the invention as defined by the appended claims.

What I claim is:

1. An improved heat sink clip assembly to be used in conjunction with an electronic device package, comprising in combination:
    a pair of elongated retaining members each having two upraised ends, each member formed with an inner shoulder having at least one inward tongue and hooks at both upraised ends; being readily retained at opposite side of said package;
    a finned heat sink placed over said package in surface contact thereto and having holders at opposite sides, each holder being formed with a depending leg to engage an outer part of said retaining members, respectively; and
    a wire clip in substantial U-shape, detachably engaged with all said hooks to secure the whole assembly all together.

2. The improved heat sink clip assembly according claim 1, wherein said clip has two free ends and is deflected at both free ends.

* * * * *